United States Patent
Huss

(10) Patent No.: US 8,489,969 B2
(45) Date of Patent: Jul. 16, 2013

(54) METHOD AND APPARATUS RELATING TO CHANNEL DECODING

(75) Inventor: Fredrik Huss, Sundbyberg (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 13/526,651

(22) Filed: Jun. 19, 2012

(65) Prior Publication Data

US 2012/0254706 A1    Oct. 4, 2012

Related U.S. Application Data

(63) Continuation of application No. 12/302,999, filed as application No. PCT/SE2006/050180 on Jun. 1, 2006, now Pat. No. 8,230,306.

(51) Int. Cl.
*G06F 11/00*    (2006.01)

(52) U.S. Cl.
USPC .......................................................... 714/781

(58) Field of Classification Search
USPC .......................................................... 714/781
See application file for complete search history.

(56) References Cited

U.S. PATENT DOCUMENTS

2009/0239585 A1    9/2009    Huss

OTHER PUBLICATIONS $3^{rd}$ Generation Partnership Project; Technical Specification Group GSM/EDGE Radio Access Network; Channel coding (Release 6). 3GPP TS 45.003 v6.3.0 (Apr. 2004).
$3^{rd}$ Generation Partnership Project; Technical Specification Group GSM./EDGE Radio Access Network; Mobile radio interface layer 3 specification; Radio Resource Control (RRC) protocol (Release 7). 3GPP TS 44.018 v7.3.1. (Feb. 2006).
"Mobile Station-Base Station System (MS-BSS) interface; Data Link (DL) layer specification". 3GPP TS 44.006, v6.3.0. (Jan. 2006).
$3^{rd}$ Generation Partnership Project; Technical Specification Group GSM/EDGE Radio Access Network; Channel coding (Release 6). 3GPP TS 45.003 v6.9.0 (Jan. 2006).

*Primary Examiner* — Bryce Bonzo

(57) ABSTRACT

The present invention relates to channel decoding and provides ways and means for improved channel decoding of data frames. The frame has been channel encoded and transmitted to a receiver. The frame includes a part with information that is unknown to the receiver and another part with information for which the receiver generates at least one data hypothesis predicting its information content. The receiver performs a hypothesis-based decoding of the received encoded frame, wherein the at least one data hypothesis is used to improve a probability of successful decoding. The invention may advantageously be used to improve decoding of frames containing short control messages with fill bits, e.g. acknowledgement messages.

35 Claims, 5 Drawing Sheets

METHOD AND APPARATUS RELATING TO CHANNEL DECODING

CROSS-REFERENCE TO RELATED APPLICATIONS

This application is a continuation of U.S. application Ser. No. 12/302,999, filed Dec. 1, 2008, now U.S. Pat. No. 8,230,306, which was a 371 of International Application No. PCT/SE06/50180, filed Jun. 1, 2006, the disclosure of which is incorporated herein by reference.

TECHNICAL FIELD

The present invention pertains to the field of communications, and in particular to the part of this field that relates to channel decoding.

BACKGROUND

In, for example, data- and telecommunications, it frequently happens that information has to be transmitted over a channel that is subject to disturbances of some sort. If the information is not successfully received at a recipient, the information may have to be retransmitted. This is of course something that preferably is to be avoided, if communications resources are to be efficiently used. To improve the likelihood of successful reception of information, various techniques have been developed. For example, use of appropriate selection of access or modulation scheme, channel coding, interleaving etc.

The above applies in particular to wireless communications, where communications are performed over radio channels, since there are many ways for the radio channel to be disturbed, e.g. by various forms of fading, by interference, by noise etc.

In, for example, a GSM system (Global System for Mobile Communications), information is transmitted between a Mobile Station (MS) and Base Station (BS) using radio signals. Several logical channels are defined in order to support transmissions of different types of information. In general, the logical channels are divided into traffic channels and control channels. Traffic channels carry user data, e.g. speech, and control channels carry information used by the system, e.g. for setting up calls. Each logical channel is coded and modulated in a transmitter and sent using a radio signal. The coding involves channel coding, e.g. convolutional codes, and interleaving to protect the information from the disturbances influencing the radio channel. At a receiver, the radio signal is demodulated and then decoded for each logical channel.

For proper operation, it is important to balance a design of the channel encoding and interleaving between different channels. For example, if the coding of the control channels is too weak, then calls might be dropped due to bad reception even if e.g. the speech is decoded correctly. This was, for example, seen in the GSM system when Adaptive Multi Rate (AMR) speech was introduced. AMR is an improved coding of speech, which increases capacity and/or coverage. When the speech coding was improved, the control channels became a bottleneck of the system.

A particular difficulty occurs when responsibility for a connection to a mobile station is to be switched from a currently serving base station to new serving base station, a process known as handover or hand-off. When the mobile station is about to loose the connection to the currently serving base station in one cell, the connection must be quickly transferred the new serving base station in a neighbouring cell. The communications needed to achieve handover is sent on the control channels. First, a Base Station Controller (BSC) is continuously notified about the reception characteristics of the current cell and neighbouring cells using measurement reports. At some point in time, the BSC decides that a handover should be made and sends a handover command via the serving base station to the mobile station. The mobile station then replies with an acknowledgement. The handover command is often so long that it has to be sent in several frames, and each successfully received frame must then be acknowledged. If the serving base station fails to decode a sent acknowledgement, an unnecessary retransmission is effected. This extends the duration of the handover process and therefore increases a probability that the connection will be lost.

In later versions of the GSM standard some improvements have been made to the control channels ("Mobile Station-Base Station System (MS-BSS) interface; Data Link (DL) layer specification", 3GPP TS 44.006, V6.3.0). For the handover commands, the mobile station can combine original transmissions with retransmissions in order improve a probability of successful decoding of the handover command. The same applies to the BS with respect to the measurement reports from the mobile station. However, the above-mentioned difficulty with the acknowledgements still remains.

SUMMARY

The present invention addresses a problem of providing ways and means that may be used to overcome at least one of the above-mentioned drawbacks.

According to one aspect of the invention, the above-stated problem is solved by providing a method for channel decoding of a received channel encoded frame. The received channel encoded frame has been generated by channel encoding of a frame that includes at least a first part with information that is unknown to a recipient and at least a second part with information for which at least one data hypothesis can be generated. In accordance with the method, at least one data hypothesis is generated for the second part of the frame. A hypothesis-based channel decoding is performed on the received channel encoded frame, wherein the at least one data hypothesis is used to increase a probability of successful decoding.

According to another aspect of the invention, the above-stated problem is solved by providing a channel decoding arrangement for channel decoding of a received channel encoded frame. The received channel encoded frame has been generated by channel encoding of a frame that includes at least a first part with information that is unknown to a recipient and at least a second part with information for which at least one data hypothesis can be generated. The arrangement includes a hypothesis-based portion that is adapted to perform a channel decoding of the received channel encoded frame using the at least one generated data hypothesis for the second part of the frame in order to increase a probability of successful decoding.

According to yet another aspect of the invention, the above-stated problem is solved by providing a node for wireless communications system, wherein the node includes the above-described arrangement.

One advantage of the invention is that it provides for improved channel decoding of received channel encoded frames. This applies in particular to frames that contain a large portion of fill bits or otherwise known or "almost known" information. The improved channel decoding according to the invention may be advantageously applied to the above-mentioned acknowledgements sent from the mobile station to the base station during the handover process, thereby reducing the risk for lost connections.

DETAILED DESCRIPTION

Figure 1:
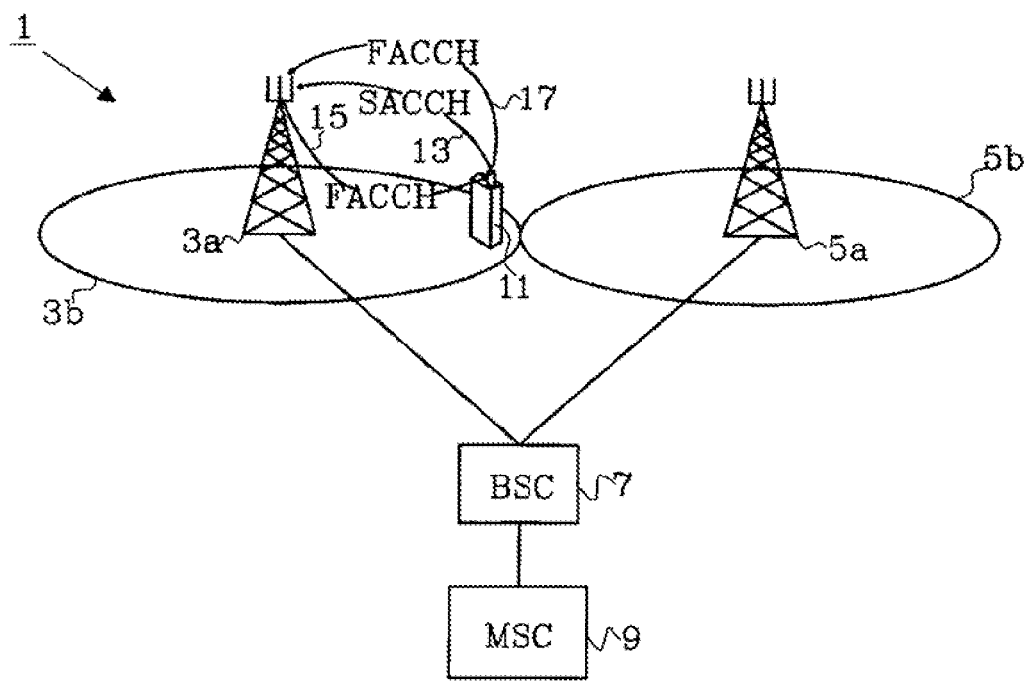
FIG. 1 is block diagram illustrating a portion of a GSM system.

The invention will now be described further using exemplary embodiments and referring to the drawings. Below, the invention is described in relation with the GSM system. However, this done only to provide clear and easy-to-follow examples; and the invention is not limited to use in the GSM system or to use in wireless systems.

FIG. 1 is a block diagram of a portion of a GSM system 1 and illustrates a situation wherein the present invention may be advantageously applied. A Base Station Controller (BSC) 7 is connected, by way of example, to two Base Stations (BS) 3a and 5a, which provide radio coverage in respective cells 3b and 5b. The BSC 7 is also connected to a Mobile Services Switching Centre (MSC) 9, which provides switching capabilities and a connection to the rest of the system (not shown). A Mobile Station (MS) 11 is currently served by BS 3a. The MS 11 regularly measures various receipt characteristic associated with the currently serving BS 3a and the BS 5a of the neighbouring cell 5b. In the example of FIG. 1, there is only the neighbouring cell 5b. However, in a general situation, there may of course be any number of further neighbouring cells to measure. The measured receipt characteristic are sent in reports 13 to the BSC 7 via the serving BS 3a. In the GSM system, these reports 13 are sent using a Slow Associated Control Channel (SACCH). The BSC 7 evaluates the received reports 13, and at some point in the BSC 7 may decide that it is time to perform a handover from BS 3a to BS 5a. When this happens, the BSC 7 sends a handover command 15 to the MS 11 via the BS 3a. In the GSM system, the handover command 15 is sent using a Fast Associated Control Channel (FACCH). The MS 11 replies to the handover command 15 with an acknowledgement 17, which in the GSM system is sent using an FACCH. The handover command 15 is often so long that it has to be divided into several frames. When this happens, the MS 11 sends an acknowledgement 17 after receipt of each frame of the handover command 15. The handover procedure is described in more detail in the standard document 3GPP TS 44.018, V7.3.1, 3.4.4.

In the GSM system, there are several variants of FACCH depending on which type of Traffic Channel (TCH) the FACCH is associated with:

FACCH/F, which is associated with TCH/F
FACCH/H, which is associated with TCH/H
E-FACCH/F, which is associated with E-TCH/F
O-FACCH/F, which is associated with O-TCH/F
O-FACCH/H, which is associated with O-TCH/H.

These variants of FACCH may all be used in the above-indicated handover process.

Figure 2:
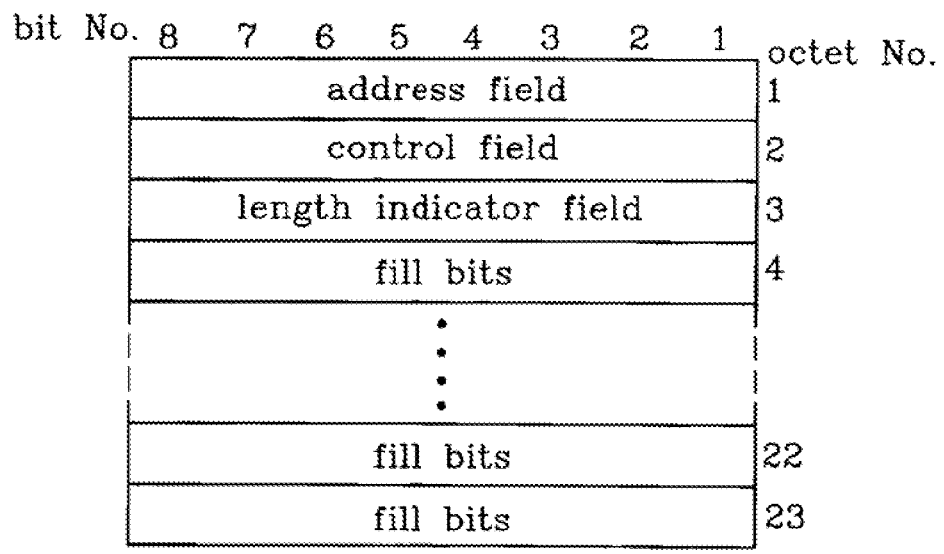
FIG. 2 is diagram illustrating a frame structure used for acknowledgements in the GSM system.

FIG. 2 is a diagram illustrating a frame format for the acknowledgement 17 as specified in the GSM standard. The frame includes 23 octets, each octet consisting of 8 bits of information. The first three octets are, in turn, an address field, a control field and a length indicator field. For the purpose of the acknowledgement, the control field is used. The other 20 octets are simply fill bits without any particular significance. The frame structure of FIG. 2 is used in GSM for all frames where there is no actual information field.

Figure 3:
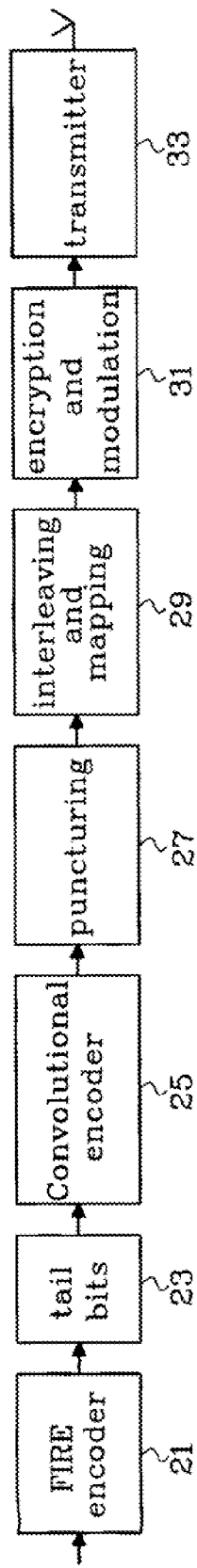
FIG. 3 is a block diagram illustrating a conventional equipment chain for transmitting the frame of FIG. 2.

Reference is now made FIG. 3, which is block diagram illustrating a typical example of a conventional equipment chain that may used for transmitting the acknowledgement frame of FIG. 2 on the FACCH from the MS 11 to the BS 3a. The frame is first channel encoded, which is here performed in three steps.

Firstly, an outer channel encoding is applied to the frame, which provides the frame with redundancy information for error detection and correction. In FIG. 3 and in the GSM standard, the outer channel encoding is performed by a FIRE encoder 21, which provides the frame with a Cyclic Redundancy Check (CRC). According to GSM standard, the FIRE encoder 21 operates based on a specified generator polynomial:

$$g(D)=(D^{23}+1)*(D^{17}+D^3+1)$$

The CRC is generated by performing polynomial division between a polynomial describing an input sequence to the FIRE encoder 21 and the polynomial g(D) and taking an inverse of remainder bits.

Secondly, the channel encoding involves an inner encoding which in FIG. 3 and in the GSM standard is performed by a convolutional encoder 25. In the convolutional encoder 25, an input sequence is convoluted against a number of impulse responses, and the results of these convolutions are thereafter multiplexed. The GSM standard specifies either a rate-1/2 or a rate-1/6 convolutional encoder. The rate-1/2 convolutional encoder is used with FACCH/F, FACCH/H and E-FACCH/F, and its operation is based on the generator polynomials:

$$G0(D)=1+D^3+D^4$$

$$G1(D)=1+D+D^3+D^4$$

The rate-1/6 convolutional encoder is used with O-FACCH/F and O-FACH/H, and its operation is based on the generator polynomials:

$$G4(D)=1+D^2+D^3+D^5+D^6$$

$$G4(D)=1+D^2+D^3+D^5+D^6$$

$$G5(D)=1+D+D^4+D^6$$

$$G5(D)=1+D+D^4+D^6$$

$$G6(D)=1+D+D^2+D^3+D^4+D^6$$

$$G7(D)=1+D+D^2+D^3+D^6$$

The generator polynomials are in principle just a convenient way of describing the impulse response characteristics of the convolutional encoder 25. For example, G5(D) corresponds to an impulse response sequence h={110101}.

A unit 23 is arranged between the FIRE encoder 21 and the convolutional encoder 25. The unit 23 adds tail bits to an output of from FIRE encoder 21. The tail bits (usually zeros) are provided in order terminate the convolutional encoder 21 in a known manner, which is necessary for proper decoding.

The third step of the channel encoding is performed in a puncturing unit 27, which performs puncturing of an output from the convolutional encoder 25. Puncturing is a process where data bits are selectively removed in order to adapt a resulting coding rate of the channel encoding process. According to the GSM standard puncturing is only performed for O-FACCH and O-FACCH/H, and not for any other variant of FACCH.

Figure 5:
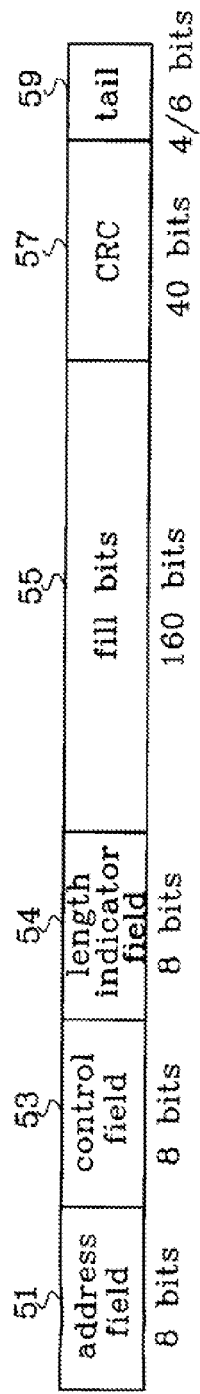
FIG. 5 is diagram illustrating an intermediate channel encoded frame.

FIG. 5 is a diagram illustrating an intermediate encoded frame forming an output of the tail bit appending unit 23 and an input to the convolutional encoder 25. In addition to the address, control and length indicator fields 51, 53 and 54 and the fill bits 55, the intermediate frame includes a CRC field 57 generated by the FIRE encoder 21 and a tail bit field 59 generated by the unit 23. The number of bits of each part of the intermediate frame is indicated in the figure. The number of tail bits depends on whether the rate-1/2 convolutional encoder (four tail bits) or the rate-1/6 convolutional encoder (six tail bits) is being used. In general, the number of tail bits should correspond to the order of the highest order generator polynomial used by the convolutional encoder 25.

Figure 6:
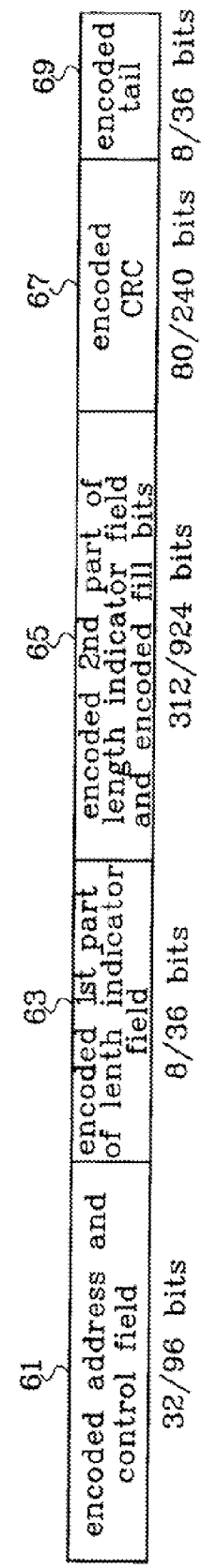
FIG. 6 is a diagram illustrating a channel encoded frame.

FIG. 6 is diagram illustrating an encoded frame forming an output from the convolutional encoder 25. The encoded frame includes a field 61 containing to the encoded address and control fields 51 and 53. The encoded frame further includes a field 63 containing an encoded first part of the length indicator field 54. The field 63 includes those encoded bits of the length indicator field 54 that depend on the information in the control field 53. In this example, the encoding of the first 4 bits of the length indicator field 54 depend on the control field 53 when the rate-1/2 convolutional encoder is used, and the field 63 will in this case consist of 8 bits. In the case of the rate-1/6 convolutional encoder, the encoding of the first 6 bits of the length indicator field 54 depends on the control field 53, and the field 63 will consist of 36 bits. The encoded frame further includes a field 65 which includes an encoded second part of the length indicator field 54 and the encoded fill bits 55. The encoded frame also includes a field 67 containing the encoded CRC field 57 and a field 69 containing the encoded tail bits 59. The number of bits in each indicated field of the encoded frame, for both the rate-1/2 convolutional encoder and the rate-1/6 convolutional encoder, is shown in the figure. Consequently, for the rate-1/2 convolutional encoder, the encoded frame consists of 456 bits, and for the rate-1/6 convolutional encoder the encoded frame consists of 1380 bits. When puncturing is used, the GSM standard specifies removal of 12 bits from the encoded frame, thus resulting in 1368 bits.

An output from the puncturing unit 27, or the convolutional encoder 29 when puncturing is not used, is inputted to a unit 29, which performs interleaving and burst mapping. An output from the unit 29 is inputted to a unit 31, which performs encryption and modulation. The encrypted and modulated signal from the unit 31 is provided to a radio transmitter 33, which transmits the provided signal as radio signal to the serving BS 3a.

Figure 4:
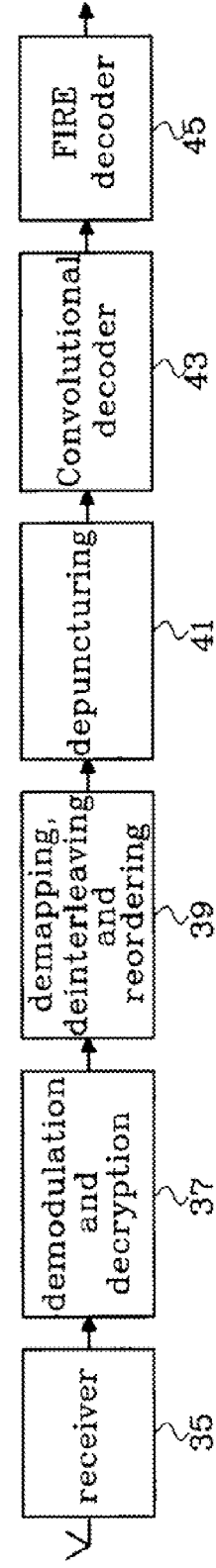
FIG. 4 is a block diagram illustrating a conventional equipment chain for receiving a signal transmitted from the equipment chain of FIG. 3.

Reference is now made to FIG. 4, which is block diagram illustrating typical example of a conventional equipment chain that may be used in the serving base station 3a for receiving the acknowledgement 17 sent from the MS 11 on the FACCH. The design and operation of the equipment chain in FIG. 4 mirror the design and operation of the equipment chain in FIG. 3. Consequently, there is provided a radio receiver 35 that receives the radio signal from the radio transmitter 33. The radio receiver 35 converts the radio signal into a digital base-band signal. A unit 37 is connected to the radio receiver 35 and adapted to receive the digital base-band signal. The unit 37 demodulates and decrypts the digital base-band signal. The operation of the unit 37 results in so-called soft information, i.e. information corresponding to a probability of whether each transmitted bit was "0" or "1". The soft information is further processed in a unit 39, which performs burst demapping and deinterleaving. In the case of the acknowledgement 17 being transmitted on O-FACCH/F or O-FACCH/H, depuncturing is performed in a depuncturing unit 41 by inserting zeroes for those bits that were removed by the puncturing unit 27. The equipment chain of FIG. 4 finally includes a convolutional decoder 43 and a FIRE decoder 45. The convolutional decoder 43 receives soft information corresponding to the encoded frame of FIG. 6. The convolutional decoder performs convolutional decoding, e.g. by using the well-known viterbi algorithm. An output from the convolutional decoder 43 is inputted to the FIRE decoder 45, which performs additional error detection and correction using the CRC.

Reference is now made again to FIG. 2. In the case of the acknowledgement frame of FIG. 2, the first bit of the length indicator field (third octet) is always set to one and rest of the bits of this field are always set to zero. According to the GSM standard, all the fill bit octets either consist of "0010101" or of "11111111" for acknowledgement frames sent by the MS 11 on the FACCH to the serving BS 3a. Consequently, only the two first octets, address and control fields, are unknown to the receiving BS 3a. The rest of the frame is known or "almost known". It is, therefore, possible to create one or more data hypotheses for the part of the frame that is not unknown. In this case, two hypotheses can be made, one for each of the two above-described possibilities for the fill bits. According to the present invention, it is suggested to create such data hypotheses and to use them for improving a channel decoding process.

Figure 7:
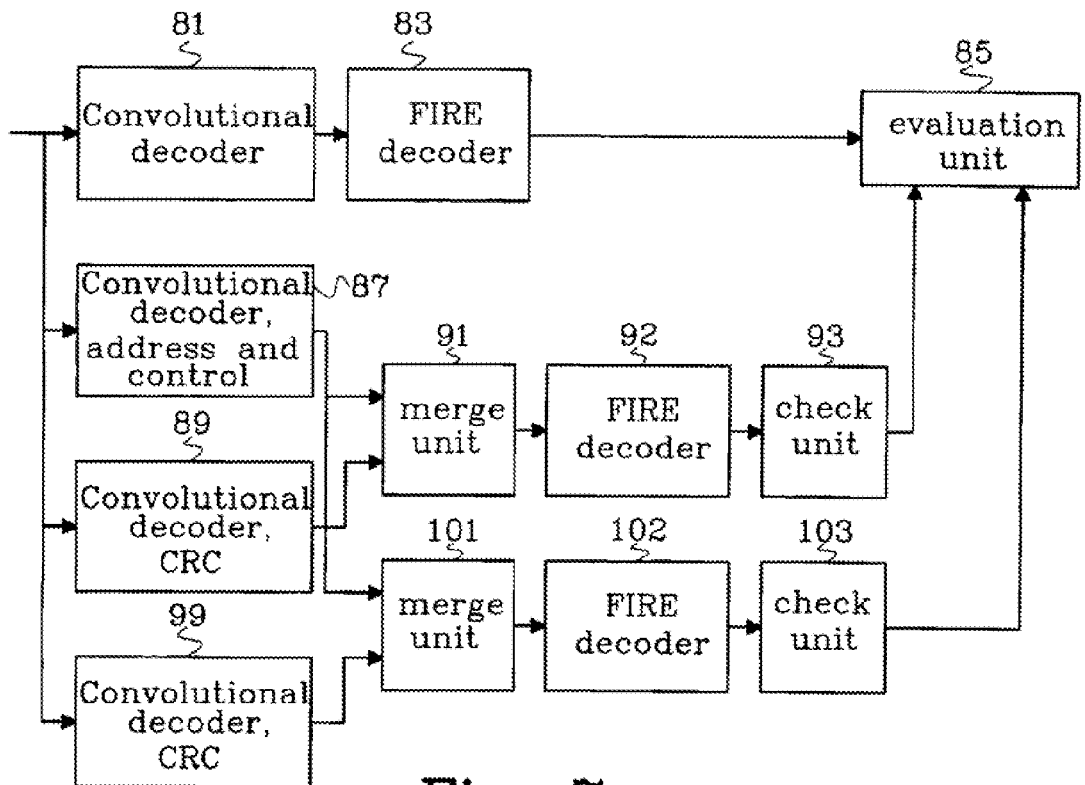
FIG. 7 is block diagram illustrating a channel decoding arrangement according to an embodiment of the invention.

Reference is now made to FIG. 7, which is a block diagram illustrating a channel decoding arrangement according to an embodiment of the invention. The arrangement of FIG. 7 may be used to replace the convolutional decoder 43 and the FIRE decoder 45 in FIG. 4. The arrangement of FIG. 7 includes a conventional portion and a hypothesis-based portion. The conventional portion includes a convolutional decoder 81 and FIRE decoder 83, which operate in the same manner as the convolutional decoder 43 and the FIRE decoder 45 in FIG. 4. An evaluation unit 85 is connected to the FIRE encoder 83. The evaluation unit 85 evaluates whether the channel decoding in the conventional part has been successful. If not, the evaluation unit 85 initiates channel decoding in the hypothesis-based portion of the arrangement. This portion includes a convolutional decoder 87, which is adapted to perform convolutional decoding of soft information corresponding to the encoded unknown address and control fields 61 and the encoded first part of the length indicator field 63. The convolutional decoder 87 uses the data hypotheses by taking the above-mentioned first part of the known length indicator field 54 for use as tail bits for purpose of the convolutional decoding of the field 61. The hypothesis-based portion further includes a convolutional decoder 89, which is arranged for decoding the encoded CRC and the encoded fill bits, i.e. soft information corresponding to the fields 67 and 69. In order for the decoding to be effective, the convolutional decoder 89 must have a known start state. The convolutional decoder 89 makes use of the above-mentioned first data hypothesis for the fill bits to determine this start state. In particular, it is a last part of the fill bits, as specified by the first data hypothesis, which is used to determine the start state. The number of bits of the fill bits that are necessary to determine the start state is the same as the number of bits that are necessary to terminate the convolutional encoding, i.e. the same as the number of bits in the tail bit field 59. The tail bits in field 59 are used as tail bits for the convolutional decoder 89. A merge unit 91 is connected to the convolutional decoders 87 and 89. The merge unit 91 is arranged for merging the decoded bits of the address and control fields and the decoded bits of the CRC with the length indicator field and the fill bits in accordance with the first data hypothesis. The merged bits are provided to a FIRE decoder 92, which performs error detection and correction on the merged bits. A check unit 93, which is optional, is connected the FIRE decoder 92. The check unit 93 checks that none of the bits of the first data hypothesis have been changed by the FIRE decoder 92. Since these bits are assumed to be known they should not be changed by the error correction. The check unit 93 thus has the benefit of decreasing a probability that any decoding error is undetected. Since, in this example, there are two data hypotheses, the arrangement includes also means for hypothesis-based channel decoding using the second data hypothesis. Channel decoding using the second data hypothesis may be initiated by the evaluation unit 85, e.g. if the decoding based on the first data hypothesis fails. Alternatively, channel decoding based on the second data hypothesis may be carried out in parallel with channel decoding based on the first data hypothesis. Consequently, the arrangement further includes a convolutional decoder 99, a merge unit 101, a FIRE decoder 102, and a check unit 103 that perform the same functions as the convolutional decoder 89, the merge unit 91, the FIRE decoder 92 and the check unit 93 but using the second data hypothesis instead of the first data hypothesis. The conventional portion the arrangement is optional but has the benefit that it can also be used in situations where hypothesis-based channel decoding cannot be used or is impractical.

Figure 8:
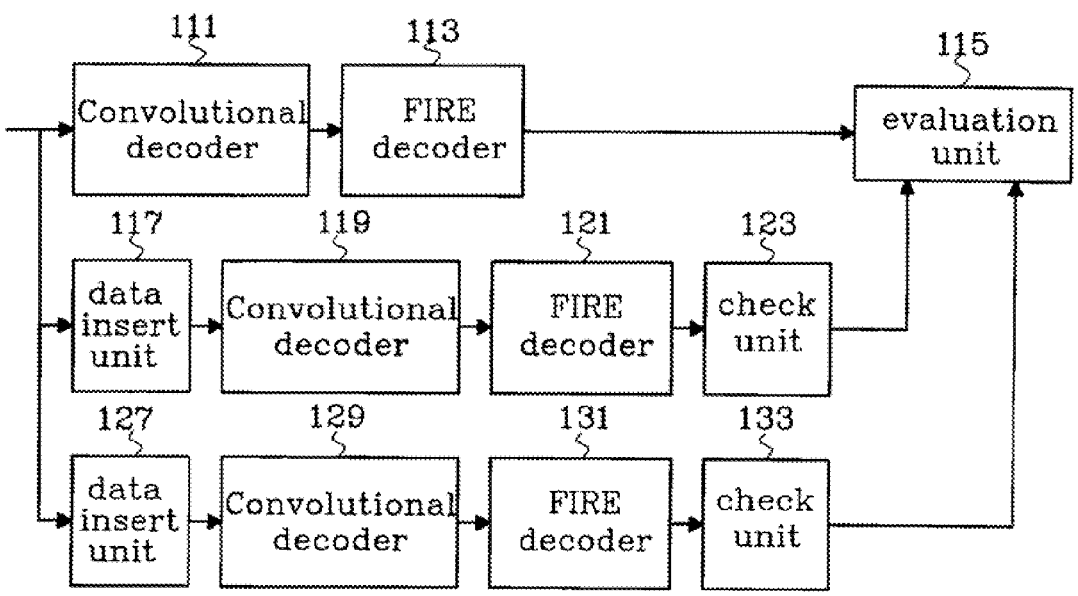
FIG. 8 is a block diagram illustrating a channel decoding arrangement according to an embodiment of the invention.

Reference is now made to FIG. 8, which is a block diagram illustrating a channel decoding arrangement according to another embodiment of the invention. The arrangement of FIG. 8 may be used to replace the convolutional decoder 43 and the FIRE decoder 45 in FIG. 4. The arrangement of FIG. 8 includes a conventional portion and a hypothesis-based portion. The conventional portion includes a convolutional decoder 111 and FIRE decoder 113, which operate in the same manner as the convolutional decoder 43 and the FIRE decoder 45 in FIG. 4. An evaluation unit 115 is connected to the FIRE encoder 113. The evaluation unit 115 evaluates whether the channel decoding in the conventional part has been successful. If not, the evaluation unit initiates channel decoding in the hypothesis-based portion of the arrangement. The hypothesis-based portion includes two branches, one for each of the above-mentioned data hypotheses. The first branch uses the first data hypothesis and includes a data insert unit 117. The data insert unit 117 first performs a convolutional encoding of the length indicator field and the fill bits as specified by the first data hypothesis. The data insert unit 117 then replaces the soft information corresponding to the field 65 of the encoded frame with the result of the encoding performed by the insert unit 117 that corresponds to encoding of the above-mentioned second part of the length indicator field and the fill bits. Note that the soft information corresponding to the field 63 cannot be replaced, since this information depends on the unknown information in the control field 53. Consequently, since soft information is replaced with "hard" information, a probability of successful decoding is increased—provided of course that the first data hypothesis is the correct hypothesis. The first branch further includes a convolutional decoder 119 connected to the data insert unit 117. The convolutional decoder 119 performs convolutional decoding on information outputted from the data insert unit 117, and an output from the convolutional decoder 119 is provided to a FIRE decoder that performs error detection and correction based on the CRC. The first branch further includes a check unit 123, which is optional. The check unit 123 checks whether any output bit from the FIRE decoder 121 that corresponds to a bit of the first data hypothesis has been changed by the error correction performed the FIRE decoder 121. Since these bits are assumed to be known, they should not be allowed to change during error correction. The check unit 123 thus has the benefit of decreasing a probability that any decoding error is undetected. The second branch of the hypothesis-based portion of the arrangement includes a data insert unit 127, a convolutional decoder 129, a FIRE decoder 131 and a check unit 133 (optional). The second branch performs the same functions as the first branch but using the second data hypothesis instead of the first data hypothesis. Channel decoding in the second branch may be initiated by the evaluation unit 115, e.g. if the channel decoding in the first branch fails. Alternatively, channel decoding in the second branch may be carried out in parallel with the channel decoding in the first branch. The conventional portion the arrangement is optional but has the benefit that it can also be used in situations where hypothesis-based channel decoding cannot be used or is impractical.

Figure 9:
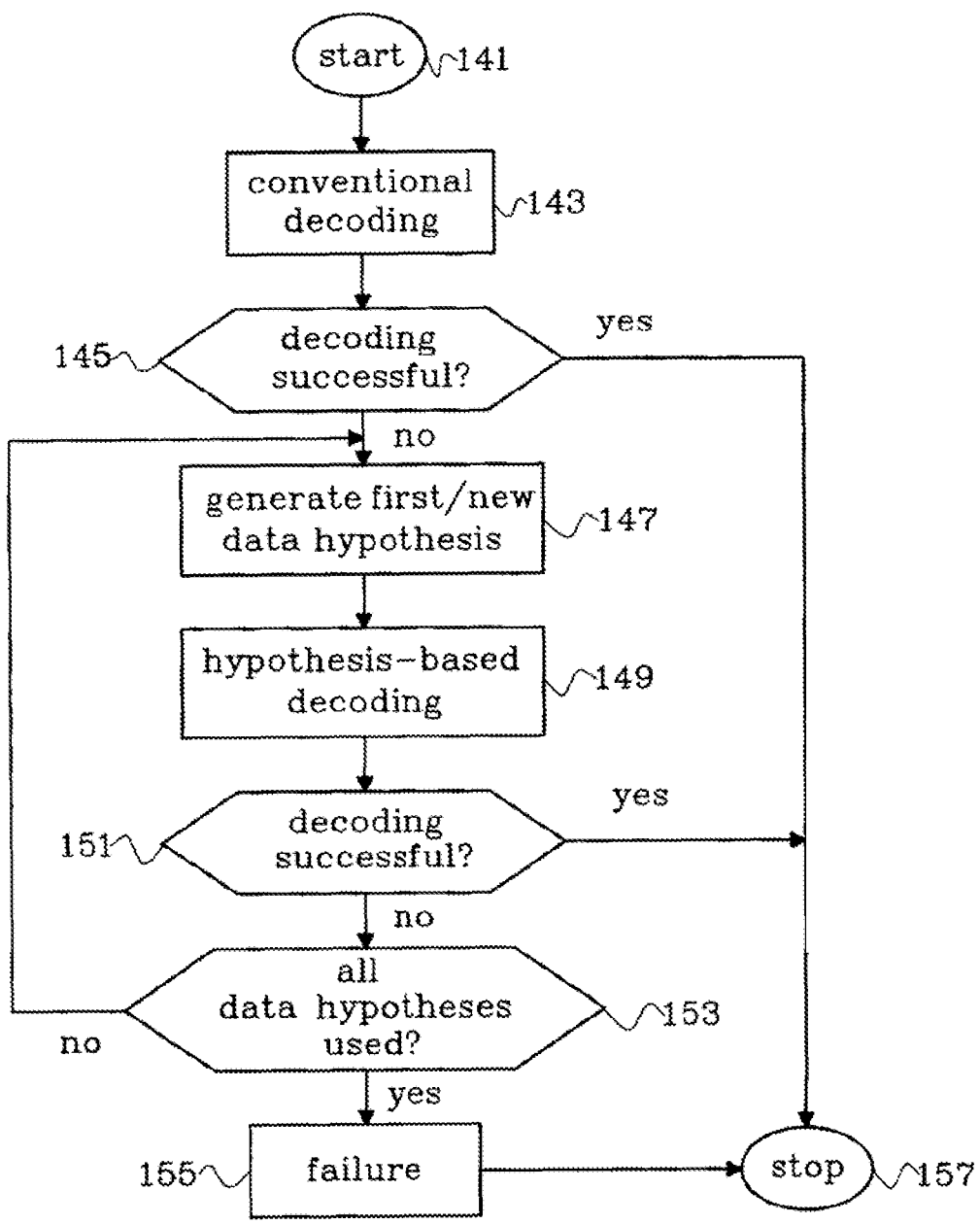
FIG. 9 is a flow chart illustrating a method for channel decoding according to an embodiment of the invention.

Reference is now made to FIG. 9, which is flow chart illustrating a method for channel decoding of a received channel encoded frame according to an embodiment of the invention. After a start 141, conventional decoding (optional), i.e. decoding that is not hypothesis-based, is performed at a block 143. At a block 145, it is determined whether the conventional decoding has been successful. If so, the method stops at a block 157. If not so, a data hypothesis is generated for a part of the frame at a block 147. At a block 149, a hypothesis-based channel decoding is performed using the generated data hypothesis for improving a probability of successful decoding. For example, the hypothesis-based channel decoding may include any number of the techniques described and indicated in connection with embodiments in FIGS. 7 and 8. At a block 151 it is determined whether the hypothesis-based channel decoding has been successful. If so, the method stops at the block 157. If not so, it is determined at a block 153 whether all available data hypotheses have been used. If there remains at least one available data hypothesis, the method returns to the block 147. The process is thus repeated until the hypothesis-based channel decoding has been successful, or all the available data hypotheses have been used without achieving successful channel decoding, in which case a failure is noted at block 155 before the method stops at the block 157.

Above, the invention has been described using various embodiments. These embodiments are, however, merely examples of how to carry out the invention, and the scope of protection afforded by the present invention is instead defined by the claims.

The invention claimed is:

1. A method for channel decoding a received channel encoded frame that has been generated from a frame that includes at least a first part with unknown information content and at least a second part with an information content for which at least one data hypothesis can be generated, the method implemented by a base station comprising the steps of:

a) generating, by the base station, at least one data hypothesis for the second part of the frame;

b) channel decoding, by the base station, the received channel encoded frame using the generated at least one data hypothesis to increase a probability of successful decoding;

wherein the channel encoded frame is a handover command acknowledgment that was received by the base station on a Fast Associated Control Channel (FACCH);

wherein the handover command acknowledgment has the first part which comprises an address field and a control field; and wherein the handover command acknowledgment has the second part which comprises a length indicator field and at least one fill bit octet, where the length indicator field per a standard has bits "10000000" and each of the at least one fill bit octet has per the standard either bits "00101011" or bits "11111111".

2. The method according to claim 1, wherein the steps a) and b) are repeated at least once.

3. The method according to claim 1, wherein the steps a) and b) are repeated until successful channel decoding is achieved or all available data hypotheses have been used.

4. The method according to claim 1, wherein the channel encoding of the frame has involved convolutional encoding, and wherein the step b) includes convolutional decoding of unknown information in the received encoded frame where the at least one data hypothesis is used to provide tail bits for the convolutional decoding of the unknown information.

5. The method according to claim 4, wherein the unknown information includes a field containing an encoded version of the first part of the frame.

6. The method according to claim 1, wherein the channel encoding of the frame has involved convolutional encoding, and wherein the step b) includes convolutional decoding of unknown information in the received encoded frame where the at least one data hypothesis is used to provide initiating bits for the convolutional decoding of the unknown information.

7. The method according to claim 6, wherein the unknown information includes a field containing an encoded version of a cyclic redundancy check relating to the frame.

8. The method according to claim 1, wherein the step b) includes replacing selected soft information forming a part of the received channel encoded frame with hard information generated based on the at least one data hypothesis.

9. The method according to claim 8, wherein the selected soft information is independent of the first part of the frame.

10. The method according to claim 1, wherein the channel encoding of the frame has involved providing redundancy information for error detection and/or correction, and wherein the step b) includes performing error detection and/or correction using the redundancy information.

11. The method according to claim 10, wherein the step b) includes checking whether there are any differences between decoded information corresponding to the second part of the frame and the at least one data hypothesis.

12. The method according to claim 1, wherein the frame is an acknowledgement frame acknowledging receipt in a mobile station of a handover command transmitted from a base station to the mobile station.

13. The method according to claim 1, wherein the method is performed in a GSM system.

14. The method according to claim 1, wherein the standard is a Global System for Mobile (GSM) communications standard.

15. A base station for channel decoding of a received channel encoded frame that has been generated from a frame that includes at least a first part with unknown information content and at least a second part with an information content for which at least one data hypothesis can be generated, the base station comprising:

an hypothesis-based portion that is adapted, when executed by a processor, for channel decoding of the received channel encoded frame using at least one generated data hypothesis for the second part of the frame in order to increase a probability of successful decoding;

wherein the channel encoded frame is a handover command acknowledgment that was received by the base station on a Fast Associated Control Channel (FACCH);

wherein the handover command acknowledgment has the first part which comprises an address field and a control field; and wherein the handover command acknowledgment has the second part which comprises a length indicator field and at least one fill bit octet, where the length indicator field per a standard has bits "10000000" and each of the at least one fill bit octet has per the standard either bits "00101011" or bits "11111111".

16. The base station according to claim 15, wherein the channel encoding of the frame has involved convolutional encoding, and wherein the hypothesis-based portion is adapted, when executed by the processor, to perform convolutional decoding of unknown information in the received encoded frame and to use the at least one data hypothesis to provide initiating bits for the convolutional decoding of the unknown information.

17. The base station according to claim 16, wherein the unknown information includes a field containing an encoded version of a cyclic redundancy check relating to the frame.

18. The base station according to claim 15, wherein the hypothesis-based portion is adapted, when executed by the processor, to replace selected soft information forming a part of the received channel encoded frame with hard information generated based on the at least one data hypothesis.

19. The base station according to claim 18, wherein the selected soft information is independent of the first part of the frame.

20. The base station according to claim 15, wherein the channel encoding of the frame has involved providing redundancy information for error detection and/or correction, and wherein the hypothesis-based portion is adapted, when executed by the processor, to perform error detection and/or correction using the redundancy information.

21. The base station according to claim 20, wherein the hypothesis-based portion is adapted, when executed by the processor, to check whether there are any differences between decoded information corresponding to the second part of the frame and the at least one data hypothesis.

22. The base station according to claim 15, wherein the channel decoding arrangement further comprises a channel decoding portion for channel decoding of the received channel encoded frame without using any data hypothesis relating to the frame.

23. The base station according to claim 15, wherein the base station complies with Global System for Mobile (GSM) communications standards.

24. The base station according to claim 15, wherein the channel encoding of the frame has involved convolutional encoding, and wherein the hypothesis-based portion is adapted, when executed by the processor, to perform convolutional decoding of unknown information in the received channel encoded frame and to use the at least one data hypothesis to provide tail bits for the convolutional decoding of the unknown information.

25. The base station according to claim 24, wherein the unknown information includes a field containing an encoded version of the first part of the frame.

26. A base station comprising:
a receiver configured to receive a channel encoded frame that has been generated from a frame that includes at least a first part with unknown information content and at least a second part with an information content for which at least one data hypothesis can be generated;
a first convolutional decoder configured to decode the first part of the received frame;
a second convolutional decoder configured to use a first data hypothesis to decode the second part of the received frame;
a third convolutional decoder configured to use a second data hypothesis to decode the second part of the received frame;
a first merge unit configured to merge decoded bits from the first convolutional decoder with decoded bits from the second convolutional decoder;
a first FIRE decoder configured to perform error detection and correction on the merged decoded bits from the first merge unit;
a second merge unit configured to merge decoded bits from the first convolutional decoder with decoded bits from the third convolutional decoder;
a second FIRE decoder configured to perform error detection and correction on the merged decoded bits from the second merge unit
wherein the channel encoded frame is a handover command acknowledgment that was received by the base station on a Fast Associated Control Channel (FACCH);
wherein the handover command acknowledgment has the first part which comprises an address field and a control field; and
wherein the handover command acknowledgment has the second part which comprises a length indicator field and at least one fill bit octet, where the length indicator field per a standard has bits "10000000" and each of the at least one fill bit octet has per the standard either bits "00101011" or bits "11111111.

27. The base station according to claim 26, further comprising:
a conventional convolutional decoder configured to decode the first and second parts of the received frame;
a conventional FIRE decoder configured to perform error detection and correction on decoded bits received from the conventional convolutional decoder; and
an evaluation unit configured to evaluate bits received from the conventional FIRE decoder to determine whether channel decoding by the conventional convolutional decoder was successful and if not then initiate channel decoding by the first convolutional decoder, the second convolutional decoder, and the third convolutional decoder.

28. The base station according to claim 27, further comprising:
a first check unit coupled to both the first FIRE detector and the evaluation unit; and
a second check unit coupled to both the second FIRE detector and the evaluation unit.

29. A method for channel decoding a received channel encoded frame, the method implemented by a base station comprising steps of:
receiving, by a receiver unit, the channel encoded frame that has been generated from a frame that includes at least a first part with unknown information content and at least a second part with an information content for which at least one data hypothesis can be generated;
decoding, by a first convolutional decoder, the first part of the received frame;
decoding, by a second convolutional decoder, the second part of the received frame using a first data hypothesis;
decoding, by a third convolutional decoder configured, the second part of the received frame using a second data hypothesis;
merging, by a first merge unit, decoded bits from the first convolutional decoder with decoded bits from the second convolutional decoder;
performing, by a first FIRE decoder, error detection and correction on the merged decoded bits from the first merge unit;
merging, by a second merge unit, decoded bits from the first convolutional decoder with decoded bits from the third convolutional decoder;
performing, by a second FIRE decoder, error detection and correction on the merged decoded bits from the second merge unit;
wherein the channel encoded frame is a handover command acknowledgment that was received by the base station on a Fast Associated Control Channel (FACCH);
wherein the handover command acknowledgment has the first part which comprises an address field and a control field; and
wherein the handover command acknowledgment has the second part which comprises a length indicator field and at least one fill bit octet, where the length indicator field per a standard has bits "10000000" and each of the at least one fill bit octet has per the standard either bits "00101011" or bits "11111111.

30. The method according to claim 29, further comprising steps of:
decoding, by a conventional convolutional decoder, the first and second parts of the received frame;
performing, by a conventional FIRE decoder, error detection and correction on decoded bits received from the conventional convolutional decoder; and
evaluating, by an evaluation unit, bits received from the conventional FIRE decoder to determine whether channel decoding by the conventional convolutional decoder was successful and if not then initiate channel decoding by the first convolutional decoder and at least one of the second convolutional decoder and the third convolutional decoder.

31. A base station comprising:
a receiver configured to receive a channel encoded frame that has been generated from a frame that includes at least a first part with unknown information content and at least a second part with an information content for which at least one data hypothesis can be generated;
a first hypothesis-base portion branch comprising a first data insert unit, a first convolutional decoder, and a first FIRE decoder:
the first data insert unit configured to (1) perform a convolutional encoding of the second part of the frame using a first data hypothesis, and (2) replace soft information corresponding to the second part of the frame with a result of the convolutional encoding of the second part of the frame using the first data hypothesis;

the first convolutional decoder configured to perform convolutional decoding on information outputted from the first data insert unit;

the first FIRE decoder configured to perform error detection and correction on information outputted from the first convolutional decoder; and a second hypothesis-base portion branch comprising a second data insert unit, a second convolutional decoder, and a second FIRE decoder:

the second data insert unit configured to (1) perform a convolutional encoding of the second part of the frame using a second data hypothesis, and (2) replace soft information corresponding to the second part of the frame with a result of the convolutional encoding of the second part of the frame using the second data hypothesis;

the second convolutional decoder configured to perform convolutional decoding on information outputted from the second data insert unit;

the second FIRE decoder configured to perform error detection and correction on information outputted from the second convolutional decoder;

wherein the channel encoded frame is a handover command acknowledgment that was received by the base station on a Fast Associated Control Channel (FACCH);

wherein the handover command acknowledgment has the first part which comprises an address field and a control field; and wherein the handover command acknowledgment has the second part which comprises a length indicator field and at least one fill bit octet, where the length indicator field per a standard has bits "10000000" and each of the at least one fill bit octet has per the standard either bits "00101011" or bits "11111111.

32. The base station according to claim 31, further comprising:

a conventional convolutional decoder configured to decode the first and second parts of the received frame;

a conventional FIRE decoder configured to perform error detection and correction on decoded bits received from the conventional convolutional decoder; and an evaluation unit configured to evaluate bits received from the conventional FIRE decoder to determine whether channel decoding by the conventional convolutional decoder was successful and if not then initiate channel decoding by the first hypothesis-base portion branch and the second hypothesis-base portion branch.

33. The base station according to claim 32, wherein:

the hypothesis-base portion branch further comprises a first check unit coupled to both the first FIRE detector and the evaluation unit; and the second hypothesis-base portion branch further comprises a second check unit coupled to both the second FIRE detector and the evaluation unit.

34. A method for channel decoding a received channel encoded frame, the method implemented by a base station comprising steps of:

receiving, by a receiver unit, the channel encoded frame that has been generated from a frame that includes at least a first part with unknown information content and at least a second part with an information content for which at least one data hypothesis can be generated;

providing a first hypothesis-base portion branch comprising a first data insert unit, a first convolutional decoder, and a first FIRE decoder:

using the first data insert unit to (1) perform a convolutional encoding of the second part of the frame using a first data hypothesis, and (2) replace soft information corresponding to the second part of the frame with a result of the convolutional encoding of the second part of the frame using the first data hypothesis;

performing, by the first convolutional decoder, convolutional decoding on information outputted from the first data insert unit;

performing, by the first FIRE decoder, error detection and correction on information outputted from the first convolutional decoder; and providing a second hypothesis-base portion branch comprising a second data insert unit, a second convolutional decoder, and a second FIRE decoder:

using the second data insert unit to (1) perform a convolutional encoding of the second part of the frame using a second data hypothesis, and (2) replace soft information corresponding to the second part of the frame with a result of the convolutional encoding of the second part of the frame using the second data hypothesis;

performing, by the second convolutional decoder, convolutional decoding on information outputted from the second data insert unit;

performing, by the second FIRE decoder, error detection and correction on information outputted from the second convolutional decoder;

wherein the channel encoded frame is a handover command acknowledgment that was received by the base station on a Fast Associated Control Channel (FACCH);

wherein the handover command acknowledgment has the first part which comprises an address field and a control field; and wherein the handover command acknowledgment has the second part which comprises a length indicator field and at least one fill bit octet, where the length indicator field per a standard has bits "10000000" and each of the at least one fill bit octet has per the standard either bits "00101011" or bits "11111111.

35. The method according to claim 34, further comprising:

decoding, by a conventional convolutional decoder, the first and second parts of the received frame;

performing, by a conventional FIRE decoder, error detection and correction on decoded bits received from the conventional convolutional decoder; and evaluating, by an evaluation unit, bits received from the conventional FIRE decoder to determine whether channel decoding by the conventional convolutional decoder was successful and if not then initiate channel decoding by the first hypothesis-base portion branch and the second hypothesis-base portion branch.

* * * * *

UNITED STATES PATENT AND TRADEMARK OFFICE
CERTIFICATE OF CORRECTION

| | | |
|---|---|---|
| PATENT NO. | : 8,489,969 B2 | Page 1 of 1 |
| APPLICATION NO. | : 13/526651 | |
| DATED | : July 16, 2013 | |
| INVENTOR(S) | : Huss | |

It is certified that error appears in the above-identified patent and that said Letters Patent is hereby corrected as shown below:

In the Drawings:

In Fig. 6, Sheet 3 of 5, for Tag "63", in Line 2, delete "lenth" and insert -- length --, therefor.

In the Specification:

In Column 5, Lines 57-58, delete "convolutional encoder 29" and insert -- convolutional encoder 25 --, therefor.

In Column 6, Line 31, delete ""0010101"" and insert -- "00101011" --, therefor.

In the Claims:

In Column 11, Line 35, in Claim 26, delete "merge unit" and insert -- merge unit; --, therefor.

In Column 11, Line 47, in Claim 26, delete ""11111111." and insert -- "11111111". --, therefor.

In Column 12, Line 40, in Claim 29, delete ""11111111." and insert -- "11111111". --, therefor.

In Column 13, Line 37, in Claim 31, delete ""11111111." and insert -- "11111111". --, therefor.

In Column 14, Line 49, in Claim 34, delete ""11111111." and insert -- "11111111". --, therefor.

Signed and Sealed this
Third Day of December, 2013

Margaret A. Focarino
*Commissioner for Patents of the United States Patent and Trademark Office*